US008809155B2

(12) United States Patent
Ellis-Monaghan et al.

(10) Patent No.: US 8,809,155 B2
(45) Date of Patent: Aug. 19, 2014

(54) BACK-END-OF-LINE METAL-OXIDE-SEMICONDUCTOR VARACTORS

(71) Applicant: International Business Machines Corporation, Armonk, NY (US)

(72) Inventors: John J. Ellis-Monaghan, Grand Isle, VT (US); Michael J. Hauser, Bolton, VT (US); Zhong-Xiang He, Essex Junction, VT (US); Xuefeng Liu, South Burlington, VT (US); Richard A. Phelps, Colchester, VT (US); Robert M. Rassel, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/644,918

(22) Filed: Oct. 4, 2012

(65) Prior Publication Data

US 2014/0097434 A1  Apr. 10, 2014

(51) Int. Cl.
*H01L 21/336* (2006.01)
(52) U.S. Cl.
USPC ............ 438/308; 438/166; 438/476; 438/486
(58) Field of Classification Search
CPC .................. H01L 21/02672; H01L 21/02675; H01L 21/02683; H01L 29/93; H01L 29/94
USPC .................. 438/30, 486, 476, 151, 166, 308; 257/75, 347, 353, 368, E33.004
See application file for complete search history.

(56) References Cited

U.S. PATENT DOCUMENTS

| | | | |
|---|---|---|---|
| 6,268,779 B1 | 7/2001 | van Zeijl | |
| 6,429,066 B1 | 8/2002 | Brown et al. | |
| 7,145,218 B2 | 12/2006 | Eshun | |
| 7,585,722 B2 | 9/2009 | Edelstein et al. | |
| 7,714,391 B2 * | 5/2010 | Kim et al. | 257/368 |
| 7,750,408 B2 | 7/2010 | He et al. | |
| 7,812,694 B2 | 10/2010 | Ding et al. | |
| 7,816,197 B2 | 10/2010 | Kim et al. | |
| 7,943,404 B2 | 5/2011 | Ding et al. | |
| 8,008,748 B2 | 8/2011 | Collins et al. | |
| 8,028,406 B2 | 10/2011 | Ding et al. | |
| 8,053,866 B2 | 11/2011 | Welch et al. | |
| 8,089,135 B2 | 1/2012 | Lindgren et al. | |
| 8,171,435 B2 | 5/2012 | He et al. | |
| 2004/0206999 A1 | 10/2004 | Hyde et al. | |
| 2008/0102550 A1 * | 5/2008 | Kook et al. | 438/34 |

(Continued)

OTHER PUBLICATIONS

Tai et al., Degradation of Capacitance-Voltage Characteristics Induced by Self-Heating Effect in Poly-Si TFTs, Electrochemical and Solid-State Letters, 9 (6) G208-G210 (2006).

(Continued)

*Primary Examiner* — Dung A. Le
(74) *Attorney, Agent, or Firm* — Wood, Herron & Evans LLP; Anthony J. Canale (57) ABSTRACT

Device structures, design structures, and fabrication methods for a varactor. The device structure includes a first electrode formed on a dielectric layer, and a semiconductor body formed on the first electrode. The semiconductor body is comprised of a silicon-containing semiconductor material in an amorphous state or a polycrystalline state. The device structure further includes an electrode insulator formed on the semiconductor body and a second electrode formed on the electrode insulator.

9 Claims, 6 Drawing Sheets

(56) References Cited

U.S. PATENT DOCUMENTS

| | | |
|---|---|---|
| 2009/0134492 A1 | 5/2009 | Morris, III et al. |
| 2010/0230735 A1 | 9/2010 | Zhu |
| 2011/0193197 A1 | 8/2011 | Farooq et al. |
| 2011/0193221 A1 | 8/2011 | Hu et al. |
| 2011/0193235 A1 | 8/2011 | Hu et al. |
| 2011/0204969 A1 | 8/2011 | Chen et al. |
| 2011/0254160 A1 | 10/2011 | Tsai et al. |

OTHER PUBLICATIONS

Ying-Shau Chuang, "Electrical mechanism on Low Temperature Polycrystalline Silicon TFT and Nonvolatile memory TFT", Thesis, National Sun Yat-sen University (Taiwan) Jun. 25, 2012.

* cited by examiner

BACK-END-OF-LINE METAL-OXIDE-SEMICONDUCTOR VARACTORS

BACKGROUND

The invention relates generally to semiconductor device fabrication and, in particular, to device structures for a varactor, methods of forming device structures for a varactor, and design structures for a varactor.

Semiconductor devices known as varactors have a capacitance that can be varied by varying a bias voltage applied from a back electrode. Varactors are found in many complementary metal-oxide-semiconductor (CMOS) integrated circuits in circuit designs for certain applications, such as radiofrequency (RF) communications and RF wireless applications. Varactors are particularly useful as active elements in parametric circuits, such as oscillation circuits like voltage-controlled oscillators, in which the capacitance tunability of the varactor is advantageously used to tune the circuit's oscillation frequency.

Device structures, fabrication methods, and design structures are needed that improve upon conventional varactors.

SUMMARY

According to one embodiment of the present invention, a device structure for a varactor includes a dielectric layer, a first electrode on the dielectric layer, and a semiconductor body on the first electrode. The semiconductor body is comprised of a silicon-containing semiconductor material in an amorphous state or a polycrystalline state and doped to have n-type conductivity or p-type conductivity. The device structure further includes an electrode insulator on the semiconductor body and a second electrode on the electrode insulator.

According to another embodiment of the present invention, a method of fabricating a device structure includes forming a first conductive layer on a dielectric layer and forming a semiconductor layer on the first conductive layer. The semiconductor layer is comprised of a silicon-containing semiconductor material in an amorphous state or a polycrystalline state. The method further includes forming an insulator layer on the semiconductor layer and forming a second conductive layer on the insulator layer.

According to another embodiment of the present invention, a design structure is provided that is readable by a machine used in design, manufacture, or simulation of an integrated circuit. The design structure includes a dielectric layer, a first electrode on the dielectric layer, and a semiconductor body on the first electrode. The semiconductor body is comprised of a silicon-containing semiconductor material in an amorphous state or a polycrystalline state and doped to have n-type conductivity or p-type conductivity. The design structure further includes an electrode insulator on the semiconductor body and a second electrode on the electrode insulator. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
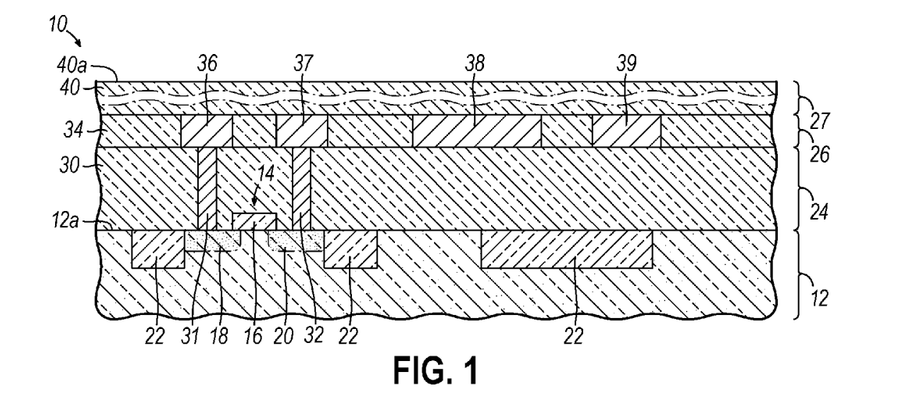
FIG. 1 is a cross-sectional view of a portion of a substrate at an initial fabrication stage of a processing method for forming a device structure for a varactor in accordance with an embodiment of the invention.

With reference to FIG. 1 and in accordance with an embodiment of the invention, a local interconnect level 24, a wiring level 26, and a via level 27 of a multi-level, back-end-of-line (BEOL) interconnect structure, generally indicated by reference numeral 10, are formed on a substrate 12. The substrate 12 may be comprised of a semiconductor material that a person having ordinary skill in the art would recognize as suitable for forming an integrated circuit. For example, the substrate 12 may be comprised of a monocrystalline silicon-containing material, such as a bulk single crystal silicon wafer, an epitaxial layer grown on a bulk substrate, or a silicon-on-insulator (SOI) layer of a SOI wafer. The substrate 12 may be lightly doped with an impurity to alter the electrical properties of the constituent semiconductor material. For example, the semiconductor material of the substrate 12 may be lightly doped with a concentration of a p-type impurity species (e.g., boron or indium).

An integrated circuit, which includes devices such as the representative active device 14, is fabricated by front-end-of-line (FEOL) processes in and on the substrate 12. The active device 14 is illustrated as a field-effect transistor having a gate stack 16 residing on a top surface 12a of the substrate 12 and source/drain regions 18, 20 in the semiconductor material of the substrate 12. One of the source/drain regions 18, 20 is a source for the device structure and the other of the source/drain regions 18, 20 is a drain for the device structure. Device designs for field-effect transistors and the details of FEOL processing are familiar to a person having ordinary skill in the art.

Shallow trench isolation regions 22 are also present in the substrate 12. The trench isolation regions 22 may be shallow trench isolation (STI) regions formed by defining interconnected trenches with photolithography and etching processes, depositing an electrical insulator to fill the trenches, and planarizing the electrical insulator relative to the top surface 12a using a chemical mechanical polishing (CMP) process. The trench isolation regions 22 may be comprised of a dielectric material, such as an oxide of silicon or tetraethylorthosilicate (TEOS), deposited by chemical vapor deposition (CVD).

The BEOL interconnect structure 10 interconnects active devices 14 of the integrated circuit and may provide circuit-to-circuit connections, or may establish contacts with input and output terminals. The local interconnect level 24, wiring level 26, and via level 27 of the BEOL interconnect structure 10 are disposed in a vertically-stacked arrangement. The BEOL interconnect structure 10 may include additional wiring levels and via levels (not shown) above wiring level 26. Wiring level 26 may represent the first wiring level that is closest to the substrate 12 in the stacked arrangement.

Local interconnect level 24 includes a dielectric layer 30 and a plurality of contacts 31, 32 residing in contact holes extending vertically through the dielectric layer 30. Wiring level 26, which may represent the first wiring level of the BEOL interconnect structure 10, includes a dielectric layer 34 and a plurality of wires 36, 37, 38, 39 residing in trenches defined in the dielectric layer 34. Wires 36, 37 are coupled with the active device 14 by contacts 31, 32. Via level 27 includes a dielectric layer 40 and via plugs (not shown) residing in vias extending vertically through the dielectric layer 40. An additional dielectric layer (not shown) may be present between the dielectric layers 34, 40 and may function as an etch stop.

Dielectric layer 30 may be comprised of an insulating material, such as silicon dioxide, phosphosilicate glass (PSG), or borophosphosilicate glass (BPSG), deposited on the top surface 12a. Contacts 31, 32 may be comprised of a conductive material, such as tungsten, deposited in openings defined in the dielectric layer 30 by photolithography and etching processes and aligned with, in this instance, the source/drain regions 18, 20 of active device 14.

The wires 36, 37, 38, 39 and the via plugs in dielectric layer 40 may be comprised of a conductive material, such as copper (Cu), aluminum (Al), alloys (e.g., AlCu) and other similar metals, deposited in trenches and openings defined in the dielectric layers 34, 40 by a damascene process. One or more liner layers (not shown) may be applied that separate the conductive and insulator materials. The liner layer may be composed of a conductor such as tantalum (Ta), tantalum nitride (TaN), titanium (Ti), titanium nitride (TiN), bilayers of these conductors, or another suitable conductor with material properties appropriate to operate as a diffusion barrier and/or an adhesion promoter.

Dielectric layers 34, 40 may comprise one or more organic or inorganic insulating materials deposited by sputtering, spin-on application, CVD, plasma enhanced CVD (PECVD), etc. The dielectric layers 34, 40 may also comprise layered combinations of two or more organic and inorganic insulating materials. Candidate inorganic insulating materials may include, but are not limited to, silicon dioxide, fluorine-doped silicon glass (FSG), and combinations of these dielectric materials. The dielectric layers 34, 40 may be comprised of one or more insulating materials with a relative permittivity or dielectric constant (i.e., low-k) smaller than the dielectric constant of silicon dioxide. Candidate low-k insulating materials include, but are not limited to, porous and nonporous spin-on organic low-k dielectrics, such as spin-on aromatic thermoset polymer resins, and porous and nonporous inorganic low-k dielectrics, such as organosilicate glasses, hydrogen-enriched silicon oxycarbide (SiCOH), and carbon-doped oxides.

Figure 2:
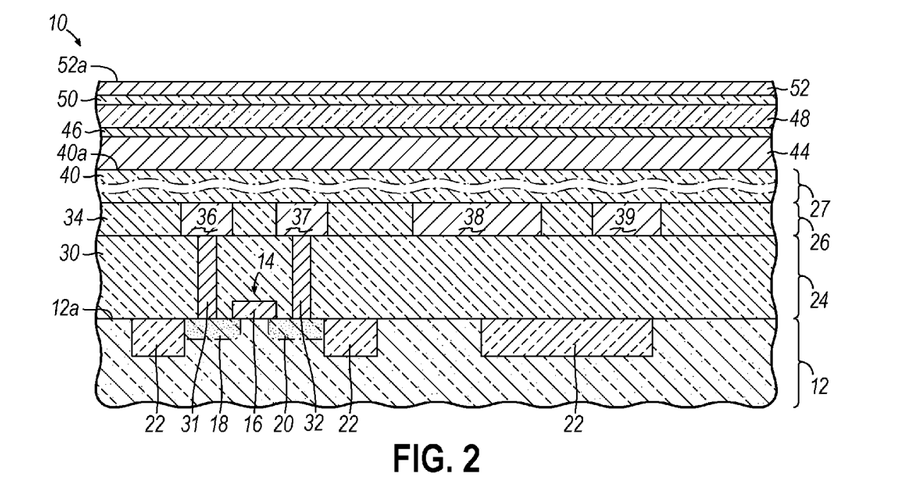
FIGS. 2-7 are cross-sectional views at successive fabrication stages of the processing method subsequent to FIG. 1.

With reference to FIG. 2 in which like reference numerals refer to like features in FIG. 1 and at a subsequent fabrication stage, layers 44, 46, 48, 50, 52 are serially deposited to define a layer stack residing on a top surface 40a of dielectric layer 40. The layers 44, 46, 48, 50, 52 may be comprised of different materials that can be selectively etched relative to the dielectric layer 40 and/or relative to each other. As used herein, the term "selective" in reference to a material removal process (e.g., etching) denotes that the material removal rate for the targeted material is higher than the removal rate for at least another material exposed to the material removal process.

Layer 44 is a conductive layer that may be comprised of the same conductors as the wires 36, 37, 38, 39. Layer 44 may include cladding on one or more sidewalls that is comprised of the same materials as the liner layers that clad wires 36, 37, 38, 39.

Layer 48 may be comprised of either a polycrystalline semiconductor material or an amorphous semiconductor material that contains primarily silicon in its composition. In one embodiment, layer 48 may comprise amorphous silicon deposited by PECVD. Following deposition in the amorphous state and as discussed hereinbelow, layer 48 may be annealed to convert the deposited material from the amorphous state to the polycrystalline state. Semiconductor material in an amorphous state has an atomic arrangement that lacks periodicity and long-range crystallographic order. In the amorphous state, the semiconductor material may be passivated by hydrogen. Semiconductor material in a polycrystalline state is characterized by long-range order only within grains of limited volume that are separated by grain boundaries and randomly connected to form a solid.

Layer 46 is a conductive layer that may comprise a metal that is capable of forming a low temperature silicide with the semiconductor material of layer 48. The layer of silicide-forming metal may be a blanket layer deposited by, for example, CVD or physical vapor deposition (PVD). In various embodiments, candidate silicide-forming metals include, but are not limited to, nickel (Ni) or titanium (Ti), each of which has a sintering temperature of 450° C. or less and is characterized in the silicide state by a resistivity in a range of 10 $\mu\Omega$-cm to 20 $\mu\Omega$-cm.

Layer 50 may be comprised of an electrical insulator, such as $SiO_2$, deposited by atomic layer deposition (ALD), PECVD, or CVD. Layer 52 is a conductive layer that may be comprised of doped polycrystalline silicon (polysilicon), a silicide, a metal, layered stacks of these materials, or any other suitable conductor capable of being deposited by, for example, CVD or PVD. In one embodiment, layer 50 may be comprised of one or more materials capable of forming a gate dielectric in a transistor construction and layer 52 may be comprised of one or more materials capable of forming a gate electrode for a transistor construction.

Figure 3:
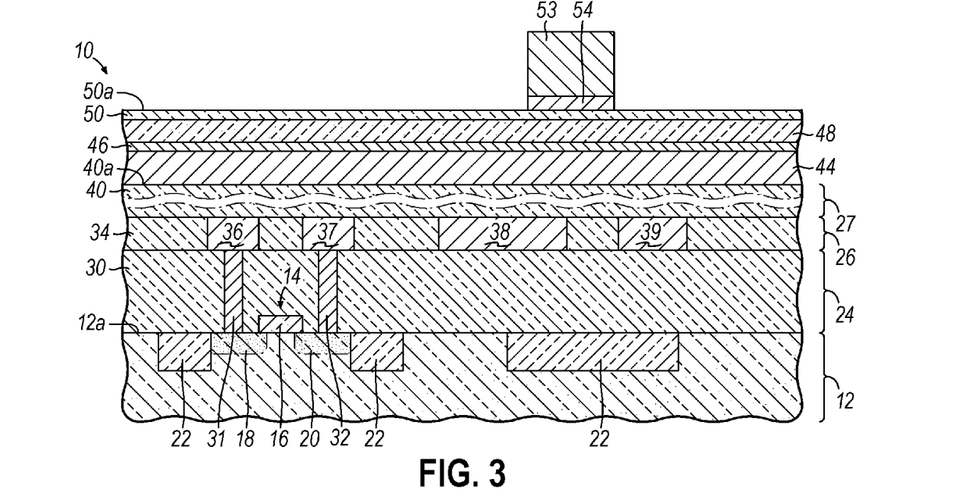

With reference to FIG. 3 in which like reference numerals refer to like features in FIG. 2 and at a subsequent fabrication stage, layer 52 (FIG. 2) is patterned using photolithography and etching processes. To that end, a photoresist layer 53 may be applied to a top surface 52a of layer 52 by a spin coating process, pre-baked, exposed to a radiation projected through a photomask, baked after exposure, and developed with a chemical developer to form an etch mask that includes a residual region coinciding with the intended spatial location of an upper electrode 54. The etching process is applied to form the upper electrode 54 by removing portions of layer 52 unprotected by the photoresist layer 55. The etching process may comprise a dry etching process, such as reactive-ion etching (RIE). The etching process, which may be conducted in a single etching step or multiple steps, relies on etch selectivity to stop on layer 50. The photoresist layer 53 may be removed by ashing or solvent stripping, followed by surface cleaning.

Figure 4:
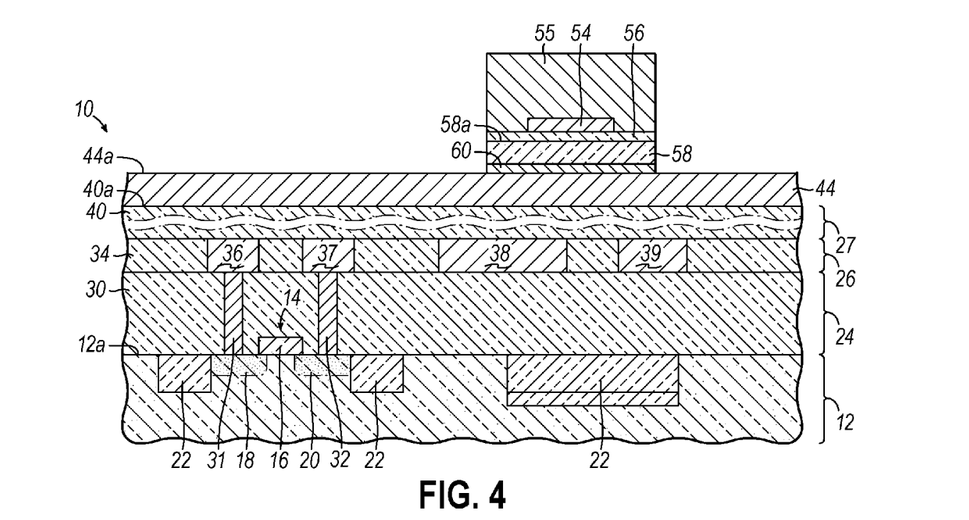

With reference to FIG. 4 in which like reference numerals refer to like features in FIG. 3 and at a subsequent fabrication stage, layers 46, 48, 50 (FIG. 3) are patterned using photolithography and etching processes. To that end, a photoresist layer 55 may be applied to a top surface 50a of layer 50 by a spin coating process, pre-baked, exposed to a radiation projected through a photomask, baked after exposure, and developed with a chemical developer to form an etch mask that includes a residual region coinciding with the intended spatial location of an electrode insulator 56, a semiconductor body 58, and a silicide-forming layer 60 that is in direct contact with the semiconductor body 58. The etching process is applied to form the electrode insulator 56 by removing portions of layer 50 unprotected by the photoresist layer 55, to form semiconductor body 58 by removing portions of layer 48 unprotected by the photoresist layer 55, and to form silicide-forming layer 60 by removing portions of layer 46 unprotected by the photoresist layer 55. The upper electrode 54 is covered and protected by the photoresist layer 55 during the etching process. The electrode insulator 56 is interposed between the upper electrode 54 and the semiconductor body 58. The etching process may comprise a dry etching process, such as RIE. The etching process, which may be conducted in a single etching step or multiple steps, relies on etch selectivity to stop on layer 48. The photoresist layer 55 may be removed by ashing or solvent stripping, followed by surface cleaning.

Figure 5:
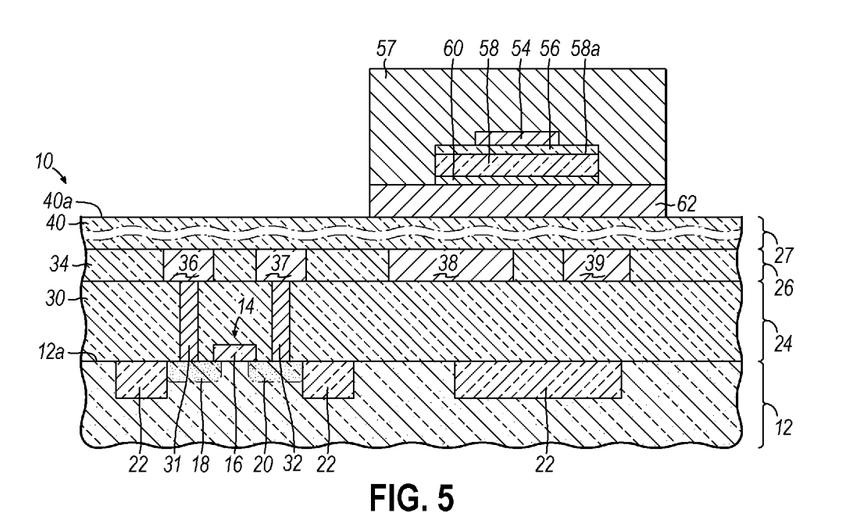

With reference to FIG. 5 in which like reference numerals refer to like features in FIG. 4 and at a subsequent fabrication stage, layer 44 (FIG. 4) is patterned using photolithography and etching processes to form a wire 62. To that end, a photoresist layer 57 may be applied to a top surface 44a of layer 44 by a spin coating process, pre-baked, exposed to a radiation projected through a photomask, baked after exposure, and developed with a chemical developer to form an etch mask that includes a residual region coinciding with the intended spatial location of wire 62 that is coupled with the varactor and biased to provide the variable capacitance. The etching process is applied to form the wire 62 by removing portions of layer 44 unprotected by the photoresist layer 57. The upper electrode 54, electrode insulator 56, semiconductor body 58, and silicide-forming layer 60 are covered and protected by the photoresist layer 57 during the etching process. The etching process may comprise a dry etching process, such as RIE. The etching process, which may be conducted in a single etching step or multiple steps, relies on etch selectivity to stop on dielectric layer 40. The photoresist layer 57 may be removed by ashing or solvent stripping, followed by surface cleaning.

Figure 6:
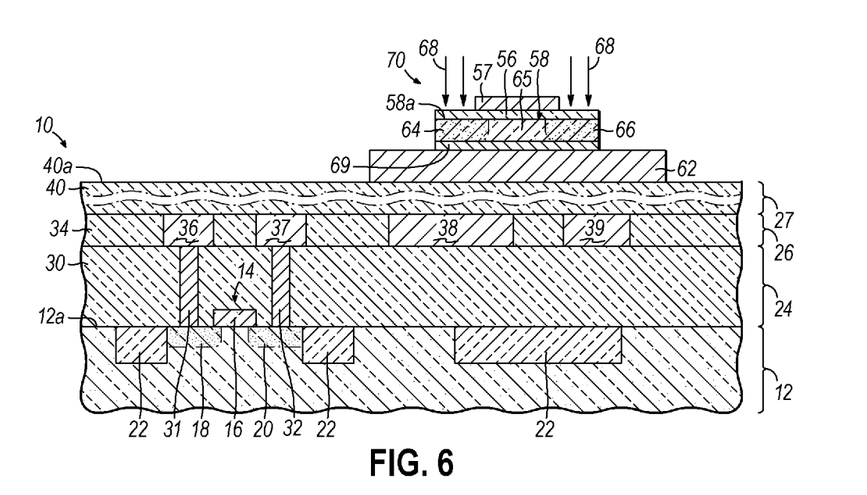

With reference to FIG. 6 in which like reference numerals refer to like features in FIG. 5 and at a subsequent fabrication stage, the semiconductor body 58 is doped by ion implantation to form doped regions 64, 66 in the semiconductor body 58. In the representative embodiment, ions 68 of an impurity species are implanted into the semiconductor body 58 in the presence of the upper electrode 54. The implantation conditions (e.g., kinetic energy and dose) are selected to provide a depth profile for the doping concentration of the doped regions 64, 66. The doping concentration may be tailored to provide a vertically-graded depth profile, which may be used to optimize a switching voltage profile for the device structure. Each implantation may be characterized by a distribution for the impurity species with a peak concentration at a projected range measured relative to a top surface 58a of the semiconductor body 58 and a range straggle that represents a standard deviation or second moment about the projected range.

In one embodiment, the ions 68 may comprise an impurity species from Group V of the Periodic Table (e.g., phosphorus (P), arsenic (As), or antimony (Sb)) that is effective to heavily dope the semiconductor material of the doped regions 64, 66 with n-type conductivity. Alternatively, the ions 68 may comprise an impurity species from Group III of the Periodic Table (e.g., boron (B), aluminum (Al), gallium (Ga), or indium (In)) that is effective to heavily dope the semiconductor material of the doped regions 64, 66 with p-type conductivity. The semiconductor body 58 may be oppositely doped so that p-n junctions are defined at the transition between the semiconductor materials of different conductivity type and a channel is defined between the doped regions 64, 66.

The semiconductor body 58 may be annealed, e.g., laser annealed, to electrically activate the dopant, as well as to convert the semiconductor material to a polycrystalline state (e.g., to convert amorphous silicon to polysilicon). In one embodiment, the activation and conversion may be accomplished using excimer laser crystallization, e.g., heating with laser radiation from a XeCl eximer laser. The excimer laser crystallization can localize the heating to the semiconductor body 58 so as to minimize damage to the wire 62.

The annealing may also simultaneously convert the silicide-forming layer 60 to a silicide layer 69 by a silicidation process that forms a silicide phase by reacting the metal in the silicide-forming layer 60 with the adjacent semiconductor material of the semiconductor body 58. Preferably, the entire silicide-forming layer 60 is converted to the silicide layer 69, but some residual unreacted metal may remain. The silicide layer 69 may function to reduce the contact resistance between the semiconductor body 58 and the wire 62.

A device structure 70 for a varactor is defined that includes the upper electrode 54 on the top surface 58a of the semiconductor body 58, the doped regions 64, 66 in the semiconductor body 58, a channel 65 in the semiconductor body 58 between the source/drain regions 64, 66, the silicide layer 69, and the wire 62 as a back electrode that can be biased relative to upper electrode 54 for varying the device capacitance. The wire 62 constituting the back electrode has a lower resistance (i.e., a higher conductivity) than the substrate (e.g., a silicon substrate) constituting the back electrode in a conventional MOS varactor fabricated using FEOL processing.

Figure 7:
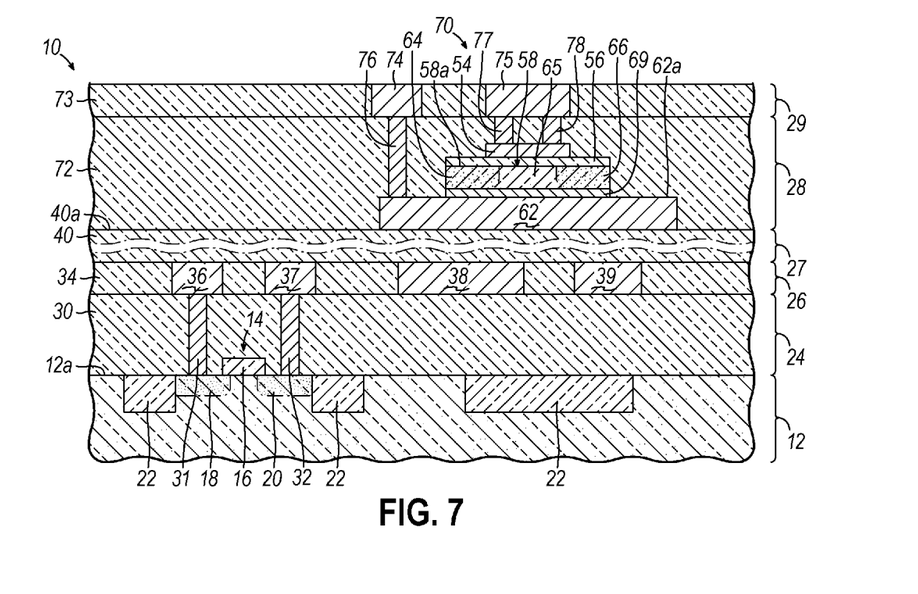

With reference to FIG. 7 in which like reference numerals refer to like features in FIG. 6 and at a subsequent fabrication stage, standard BEOL processing may follow the fabrication of the device structure 70 to form the remainder of the BEOL interconnect structure 10. The wiring and via levels of the BEOL interconnect structure 10, including wiring level 26 and via level 28, may be fabricated by damascene processes, such as a dual damascene process in which a dielectric layer is deposited, vias and trenches are etched in the dielectric layer, and the vias and trenches are filled with a conductor (e.g., copper, aluminum, or a copper-aluminum alloy) using a single blanket deposition followed by planarization. Planarization may comprise chemical mechanical polishing (CMP), which is a material removal process using both chemical reactions and mechanical erosion to remove material and planarize a surface. The damascene process may be replicated to stack multiple wiring levels so that the multi-level framework of conductive interconnections is formed. Damascene processes and the materials used in damascene processes are comprehended by a person having ordinary skill in the art. Typically, conductive features in upper wiring levels of the BEOL interconnect structure 10 may be thicker and wider, and may have a greater pitch, than features found in lower wiring levels.

In particular, the BEOL interconnect structure 10 includes a via level 28 and a wiring level 29 that include conductive features that are coupled with different portions of the device structure 70 for incorporating the device structure 70 into an integrated circuit. To that end, dielectric layers 72, 73 are deposited that cover the device structure 70 and that may be planarized to remove topography caused by the device structure 70. The dielectric layers 72, 73 may be comprised of any of the insulating materials constituting dielectric layers 34, 40. Vias and trenches are respectively defined in the dielectric layers 72, 73 using photolithography and etching processes, filled with a conductor, and planarized using CMP to define via plugs 76, 77, 78 in dielectric layer 72 and wires 74, 75 in dielectric layer 73. The wires 74, 75 and via plugs 76, 77, 78 may be respectively comprised of any of the same conductive materials constituting the wires 36, 37, 38, 39 and via plugs 31, 32.

Via plug 76 couples wire 74 with the wire 62 representing the lower electrode of the device structure 70. The contact between the lower end of the via plug 76 and a top surface 62a of the wire 62 is direct. Via plugs 77, 78 couple wire 75 with the upper electrode 54 of the device structure 70. Although not depicted in FIG. 7, the doped regions 64, 66 are likewise contacted.

Wiring level 29 may represent the second wiring level that is separated from the substrate 12 by wiring level 26 in the stacked arrangement. However, additional via and wiring levels (not shown) may be interposed between wiring level 26 and wiring level 29. The device structure 70 is interposed between the different wiring levels 26, 29 in the BEOL interconnect structure 10. Positioning the device structure 70 at a location in the BEOL interconnect structure 10 remote from the substrate 12 has the benefit of elevating the ratio of inductive reactance to resistance at a given frequency or quality factor (Q). The quality factor may increase with increasing distance from the substrate 12 as the device structure 70 is formed in higher wiring levels more remote from the substrate 12. The wire 62 representing the lower electrode of the device structure 70 is not fabricated by an FEOL process using a portion of the substrate 12 nor is any other component of the device structure fabricated by an FEOL process.

Figure 8:
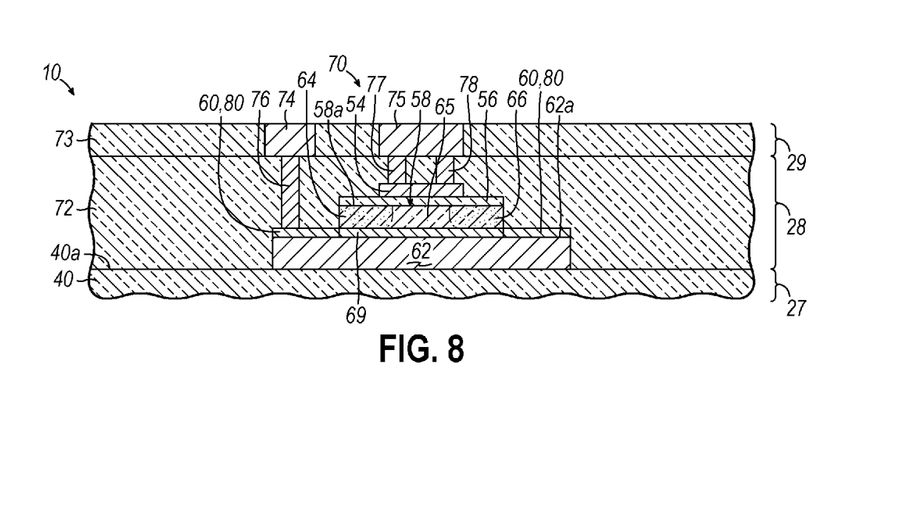
FIGS. 8-10 are cross-sectional views similar to FIG. 7 of a device structure for a varactor in accordance with alternative embodiments of the invention.

With reference to FIG. 8 in which like reference numerals refer to like features in FIG. 7 and in accordance with an alternative embodiment, the device structure 70 may be fabricated so that a residual portion 80 of the silicide-forming layer 60 covers the portion of top surface 58a of the wire 62 that is not covered by the electrode insulator 56 and semiconductor body 58. The contact between the lower end of the via plug 76 and the wire 62 is indirect due to the presence of residual portion 80 of the silicide-forming layer 60. To provide the residual portion 80 of the silicide-forming layer 60, the silicide-forming layer 60 is patterned along with the wire 62 using photoresist layer 57 (FIG. 5) instead of photoresist layer 55 (FIG. 4). The silicide layer 69 layer is formed due to the proximity of the neighboring semiconductor material of the semiconductor body 58, while the residual portion 80 of the silicide-forming layer 60 remains unreacted due to the absence of neighboring semiconductor material.

Figure 9:
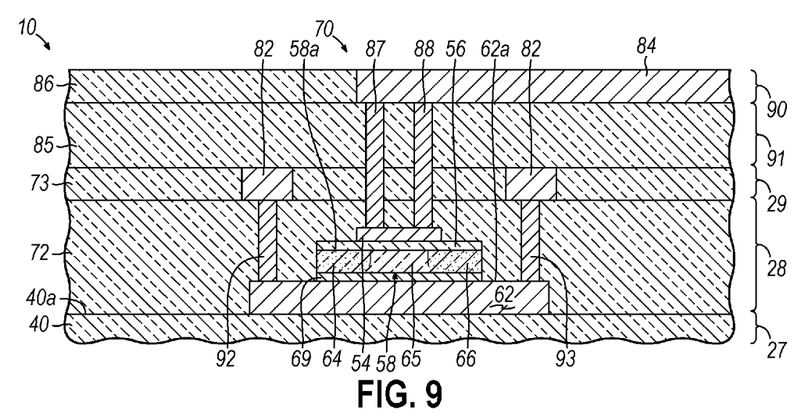

With reference to FIG. 9 in which like reference numerals refer to like features in FIG. 7 and in accordance with an alternative embodiment, wire 82 replaces wire 74 in the BEOL interconnect structure 10, and wire 84 replaces wire 75 in the BEOL interconnect structure 10. The process for fabricating the device structure 70 proceeds as described hereinabove. Wire 84 is formed as a conductive feature in a trench defined in a dielectric layer 86 and is positioned so as to partially overlie the upper electrode 54. In comparison with wire 74, wire 84 is located in a wiring level 90 that overlies or is above wiring level 29 in the BEOL interconnect structure 10. A dielectric layer 85 of a via level 91 is interposed vertically between wiring levels 29, 90 and via plugs 87, 88 are formed in vias that extend from the wire 84 through the dielectric layers 72, 73, 85, 86 to the upper electrode 54. As a result, the wire 84 that contacts the wire 62 forming the lower electrode of the device structure 70 is located in a different wiring level than the wire 75 (FIG. 7) that contacts the upper electrode 54 of the device structure 70.

Wire 82 is formed in a trench of nominally equivalent complementary dimensions and geometrical shape defined in the dielectric layer 73. In comparison with wire 74, wire 82 is lengthened and geometrically shaped so as to surround or encircle the upper electrode 54. Wire 82 may form a closed geometrical shape, such as a rectangle or circle, because wire 84 is located in a different wiring level. Via plugs 92, 93 are formed in vias that extend from the wire 82 through the dielectric layer 72 to wire 62 forming the lower electrode.

Wires 82, 84 may be comprised of the same conductive materials as wires 74, 75 and may be fabricated using the same processes used to form wires 74, 75. Dielectric layers 85, 86 may be comprised of the same insulating materials as dielectric layers 34, 40, 72, 73 and may be deposited using the same process used to deposit dielectric layers 34, 40, 72, 73.

In an alternative embodiment, wire 74 (FIG. 7) may be shaped analogously to wire 82 and, because wires 74, 75 are in the same wiring level 29, a break may be provided in the wire 74. Wire 75 has a wiring path through the break in wire 74 for establishing electrical contact with the upper electrode 54.

Figure 10:
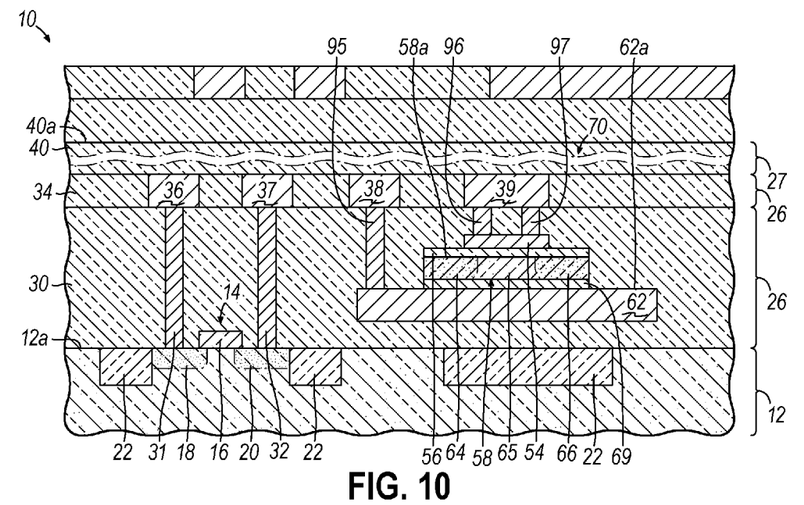

With reference to FIG. 10 in which like reference numerals refer to like features in FIG. 7 and in accordance with an alternative embodiment, the device structure 70 may be vertically relocated within the BEOL interconnect structure 10 to a location between the wiring level 26 and the substrate 12. The process for fabricating the device structure 70 proceeds as described hereinabove with the exception that the device structure is formed as part of the process forming wiring level 26. Contacts 95, 96, 97 are provided in openings defined in the dielectric layer 30. Contacts 95, 96, 97 may be comprised of the same conductive materials as contacts 31, 32 and may be fabricated using the same processes used to form contacts 31, 32. Contact 95 connects the wire 38 with the wire 62 defining the lower electrode of the device structure 70 and contacts 96, 97 connect the wire 39 with the upper electrode 54 of the device structure 70. This positioning of the device structure 70 may be beneficial because higher processing temperatures can be tolerated without harming wires in the BEOL interconnect structure 10. For example, a metal may be used for the silicide-forming layer 46 that forms a silicide at higher temperatures than Ni and Ti.

Figure 11:
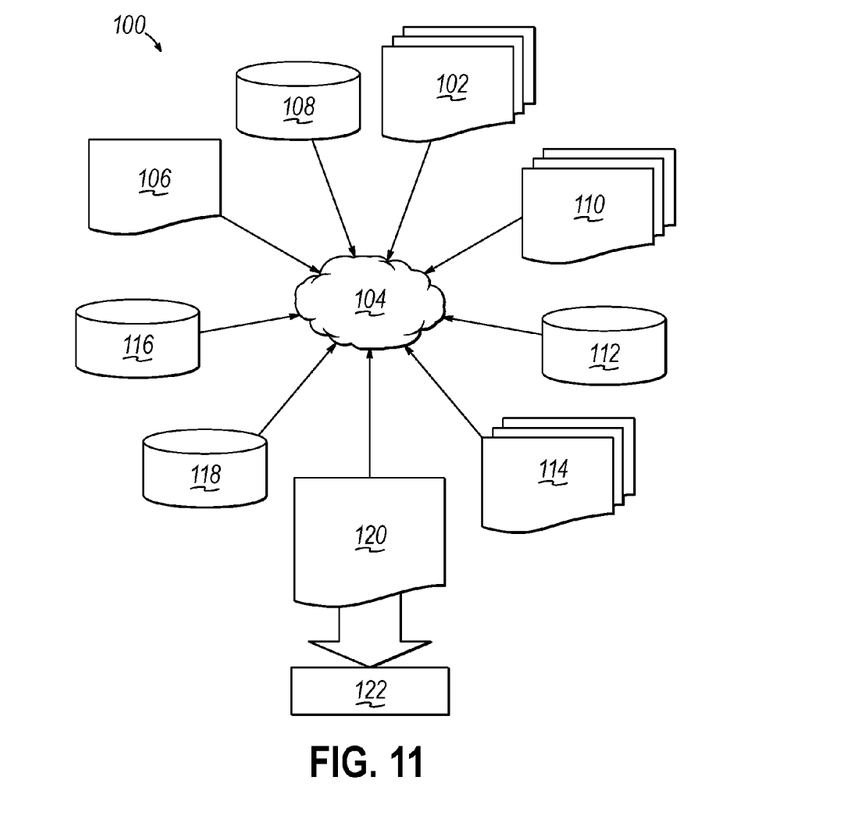
FIG. 11 is a flow diagram of a design process used in semiconductor design, manufacture, and/or test.

FIG. 11 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 6-10. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 6-10. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6-10. In one embodiment, design structure 120 may comprise a compiled, executable HDL simulation model that functionally simulates the devices shown in FIGS. 6-10.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6-10. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
   forming a first conductive layer on a dielectric layer;
   forming a semiconductor layer on the first conductive layer, the semiconductor layer comprised of a silicon-containing semiconductor material in an amorphous state or a polycrystalline state;
   forming an insulator layer on the semiconductor layer;
   forming a second conductive layer on the insulator layer;
   patterning the second conductive layer, the insulator layer, and the semiconductor layer, to respectively form a first electrode, an electrode insulator, and a semiconductor body, the electrical insulator separating the first electrode from the semiconductor body;
   after the first electrode, the semiconductor body, and the electrical insulator are formed, patterning the first conductive layer to form a second electrode; and
   forming a source region and a drain region in the semiconductor body.

2. The method of claim 1 wherein forming the semiconductor layer on the first conductive layer comprises:
   depositing the silicon-containing semiconductor material in the amorphous state on the first conductive layer to form the semiconductor layer.

3. The method of claim 1 comprising:
   after the semiconductor body is formed, laser annealing the semiconductor body to convert the silicon-containing semiconductor material from the amorphous state to the polycrystalline state.

4. A method of fabricating a device structure, the method comprising:
   forming a first conductive layer on a dielectric layer;
   forming a semiconductor layer on the first conductive layer, the semiconductor layer comprised of a silicon-containing semiconductor material in an amorphous state or a polycrystalline state;
   forming an insulator layer on the semiconductor layer; and
   forming a second conductive layer on the insulator layer;
   applying a first mask partially covering the second conductive layer;
   after the first mask is applied, etching the second conductive layer selective to the semiconductor layer to form a first electrode;
   applying a second mask partially covering the semiconductor layer and the insulator layer and covering the first electrode;
   after the second mask is applied, etching the semiconductor layer and the insulator layer selective to the first conductive layer to respectively form a semiconductor body and an electrode insulator separating the first electrode from the semiconductor body;
   applying a third mask partially covering the first conductive layer and covering the first electrode, the dielectric layer, and the semiconductor body;
   after the third mask is applied, etching the first conductive layer selective to the dielectric layer to form a wire forming a second electrode of the device structure; and
   forming a source region and a drain region in the semiconductor body.

5. The method of claim 4 further comprising:
   forming a layer of a silicide-forming metal between the semiconductor layer and the first conductive layer,
   wherein the layer of the silicide-forming metal is partially covered by the third mask and is etched when the first conductive layer is etched to form the second electrode.

6. The method of claim 4 further comprising:
   forming a layer of a silicide-forming metal between the semiconductor layer and the first conductive layer,
   wherein the layer of the silicide-forming metal is partially covered by the second mask and is etched when the semiconductor layer and the insulator layer are etched.

7. The method of claim 4 wherein forming the semiconductor layer on the first conductive layer comprises:
   depositing the silicon-containing semiconductor material in the amorphous state on the first conductive layer to form the semiconductor layer.

8. The method of claim 7 comprising:
   after the semiconductor body is formed, laser annealing the semiconductor body to convert the silicon-containing semiconductor material from the amorphous state to the polycrystalline state.

9. The method of claim 1 comprising:
   forming a layer of a silicide-forming metal between the semiconductor layer and the first conductive layer.

* * * * *